United States Patent
Kawagoe (10) Patent No.: US 7,365,024 B2
(45) Date of Patent: Apr. 29, 2008

(54) CHEMICAL SOLUTION COATING METHOD AND CHEMICAL SOLUTION COATING APPARATUS

(75) Inventor: Yoshikazu Kawagoe, Nara (JP)

(73) Assignee: Sharp Kabushiki Kaisha, Osaka (JP)

( * ) Notice: Subject to any disclaimer, the term of this patent is extended or adjusted under 35 U.S.C. 154(b) by 79 days.

(21) Appl. No.: 11/003,532

(22) Filed: Dec. 6, 2004

(65) Prior Publication Data

US 2005/0132955 A1    Jun. 23, 2005

(30) Foreign Application Priority Data

Dec. 19, 2003  (JP)  ............... 2003-423334

(51) Int. Cl.
*H01L 21/00* (2006.01)
(52) U.S. Cl. .................. 438/758; 438/780; 438/48; 257/E21.024
(58) Field of Classification Search ................ 438/758, 438/780, 48, 57
See application file for complete search history.

(56) References Cited

U.S. PATENT DOCUMENTS 6,383,948 B1    5/2002 Takahiro et al.

2002/0056473 A1    5/2002 Chandra et al.

FOREIGN PATENT DOCUMENTS

| JP | 62-121670 A | 6/1987 |
|---|---|---|
| JP | 2-33980 A | 2/1990 |
| JP | 6-82853 B2 | 10/1994 |
| JP | 2000-49075 A | 2/2000 |
| JP | 2000-332267 | 11/2000 |
| JP | 2001-110714 A | 4/2001 |
| JP | 2002-033339 | 1/2002 |
| JP | 2002-346453 | 12/2002 |
| JP | 2003-236441 A | 8/2003 |
| JP | 2003-320299 | 11/2003 |
| WO | 02/098576 A | 12/2002 |

*Primary Examiner*—Savitri Mulpuri
(74) *Attorney, Agent, or Firm*—Nixon & Vanderhye P.C.

(57) ABSTRACT

A chemical solution coating method includes: a first step of disposing a semiconductor substrate on a substrate supporting unit with a first face to be coated with a chemical solution facing upward; a second step of moving a chemical solution spraying member for spraying the chemical solution to an initial position which is positioned in the vicinity of the first face of the semiconductor substrate and where the chemical solution is to be applied; and a third step of moving the chemical solution spraying member from the initial position in accordance with a predetermined travel pattern and, simultaneously, spraying the chemical solution from the chemical solution spraying member toward the first face of the semiconductor substrate.

4 Claims, 6 Drawing Sheets

101 Nozzle
103 Chemical solution
Surface
102 Substrate
104 Back face
100 Rotating stage FIG. 6(b)
Prior Art 103 Chemical solution
102 Substrate
103'
104 Back face
100 Rotating stage

CHEMICAL SOLUTION COATING METHOD AND CHEMICAL SOLUTION COATING APPARATUS

CROSS-REFERENCE TO RELATED APPLICATION

This application is related to Japanese application No. 2003-423334 filed on Dec. 19, 2003, whose priority is claimed under 35 USC §119, the disclosure of which is incorporated by reference in its entirety.

BACKGROUND OF THE INVENTION

1. Field of the Invention

The present invention relates to a chemical solution coating method and apparatus and, more particularly, to a method and an apparatus for coating the back face of a semiconductor substrate used for a solar battery with a material for forming a diffusion preventing film.

2. Description of the Related Art

As a method of coating a semiconductor substrate with a chemical solution such as a resist, there has been used a method of dropping a chemical solution to be applied onto a semiconductor substrate and rotating the substrate at high speed, thereby coating the entire surface of the substrate with the chemical solution (hereinafter, referred to as "spin coating") (see, for example, Japanese Unexamined Patent Publication No. Sho 62(1987)-121670).

In such spin coating, the semiconductor substrate is held on a rotating stage by suction and the rotating stage is rotated at high speed, thereby spreading the chemical solution dropped on the surface of the substrate to the entire surface of the substrate.

In the case where the chemical solution is dropped on a center portion of the substrate, the chemical solution spreads from the center portion toward the peripheral portion by the centrifugal force of rotation, so that the chemical solution is applied to the entire surface of the substrate. However, part of the chemical solution is splattered from the peripheral portion of the substrate to the outside due to the centrifugal force of rotation.

There has been also proposed a chemical solution coating apparatus in which a blocking member is provided at a position close to the peripheral portion of the back face of a substrate in order to prevent a resist from spreading to the back face of the substrate in the case of coating the surface of the semiconductor substrate with a resist by using such spin coating (see Japanese Unexamined Patent Publication No. 2001-110714).

There has been also proposed a chemical solution coating method in which, in the case of applying a resist by spin coating, the pressure in a lower region of the back face opposite to a coated surface of a substrate is made high and air current is generated from the lower region to the outside of the peripheral portion of the substrate in order to prevent the back face of the substrate from getting dirty by being adhered with a resist (see Japanese Unexamined Patent Publication No. 2000-49075).

A dopant solution (for example, a solution containing $P_2O_5$ and the like) is applied to one side of a semiconductor substrate used for a solar battery by using spin coating similar to the above spin coating.

Figure 6A:
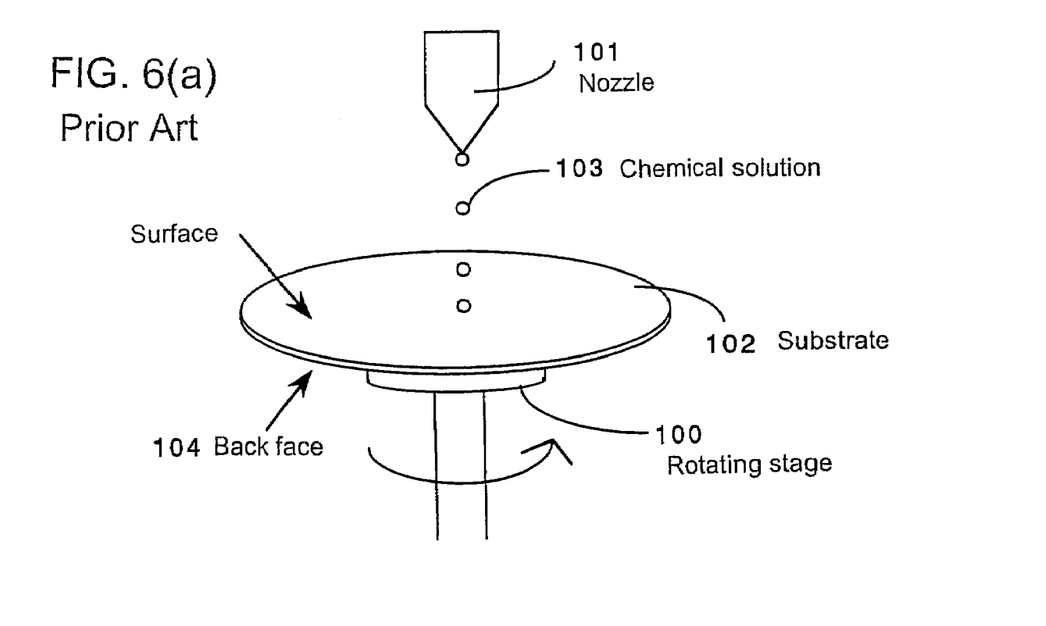
FIGS. 6A and 6B show a conventional chemical solution coating process by spin coating.
Figure 6B:
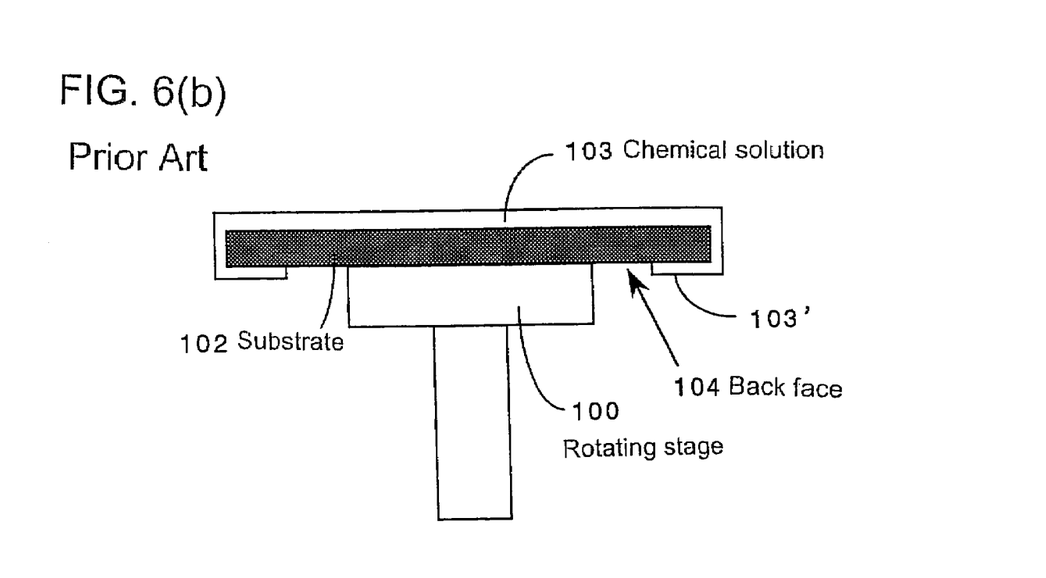

In the case of applying a dopant solution (chemical solution 103) by spin coating, as shown in FIG. 6A, by rotating a substrate 102 held on a rotating stage 100 by suction, the chemical solution 103 dropped from a nozzle 101 is applied to the entire surface of the substrate 102. As shown in FIG. 6B, however, a dopant solution 103' spreads along the side face of the peripheral portion of the substrate and even to a back face 104 of the substrate.

Generally, an electrode is formed on each of the surface and the back face of a substrate of a solar battery and current generated between the electrode is taken. It is necessary to prevent the electrodes from being electrically connected to each other.

As shown in FIG. 6B, if the dopant solution 103 spreads to the back face 104, it may cause poor insulation of the electrodes. Consequently, various devises have been proposed (see, for example, Japanese Patent Publication No. Hei 06(1994)-82853).

In Japanese Patent Publication No. Hei 06(1994)-82853, in order to prevent a PN junction layer formed on the surface from being formed on the back face, a mask solution application film is formed on the back face 104.

A masking solution 105 is used to prevent the dopant solution 103 applied on the surface from spreading to the back face, and plays the role of a diffusion preventing film. It is unnecessary to apply the masking solution 105 to the entire back face but it is sufficient to apply the masking solution along the sides of the back face in a strip shape. In the case of applying the masking solution only around the periphery of the back face, the position of dropping the chemical solution may be set to a position deviated from the center of the substrate to the periphery.

Figure 7:
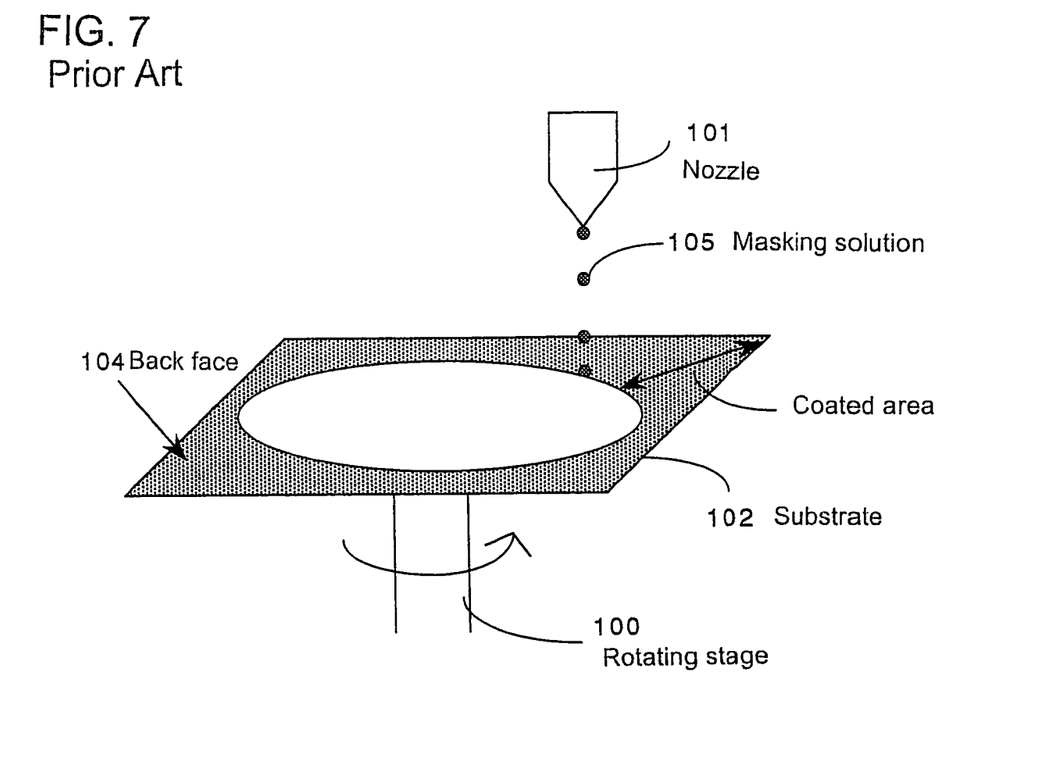
FIG. 7 shows a conventional chemical solution coating process by spin coating.

In the case of an angular substrate 102 whose shape is a quadrangle or the like as shown in FIG. 7, when the substrate 102 is held on the rotating stage 100 by suction for rotation, the masking solution is applied to an application region shown by the double-headed arrow. However, the masking solution 105 is applied also to regions to which the masking solution 105 does not have to be applied, so that the masking solution 105 is wasted. For example, in FIG. 7, it is unnecessary to apply the masking solution 105 to such large corner areas of the quadrangle. It is sufficient to apply the mask solution 105 only to areas each having a predetermined width (for example, a few mm) from each of the sides of the quadrangle.

The conventional chemical solution coating method using spin coating needs an apparatus for rotating a substrate at high speed and, further, needs a vacuum mechanism for closely attaching a rotating stage and a substrate. However, in the case where the surface of the substrate to be held by suction is rough, holding by suction is insufficient and there is a case that the substrate drops at the time of high-speed rotation. In particular, the substrate used for a solar battery is very thin like about 300 μm. Consequently, even the surface held by suction is slightly rough, holding by suction becomes insufficient and, in many cases, the substrate drops.

When the suction force is increased, however, since the substrate is very thin, the substrate cracks at the time of high-speed rotation. For the substrate for a solar battery, the suction force cannot be increased more than necessary.

In the spin coating, the substrate is rotated at high speed. Therefore, splash of the dropped chemical solution from the peripheral portion of the substrate to the outside cannot be avoided, so that a splash preventing cover or the like has to be attached.

Moreover, the splashed chemical solution is wasted, so that a chemical solution collecting mechanism may be provided on the outside but it is impossible to collect the solution perfectly. It is also difficult to prevent the chemical solution from being spread to the back face. Therefore, the amount of the chemical solution to be used cannot be reduced so much.

SUMMARY OF THE INVENTION

The present invention has been achieved in consideration of the above circumstances and an object of the present invention is to provide a chemical solution coating method and apparatus in which a substrate can be prevented from dropping, a substrate can be prevented from being cracked, and the amount of a chemical solution to be used can be reduced.

The present invention provides a chemical solution coating method comprising: a first step of disposing a semiconductor substrate on a substrate supporting unit with a first face to be coated with a chemical solution facing upward; a second step of moving a chemical solution spraying member for spraying the chemical solution to an initial position which is positioned in the vicinity of the first face of the semiconductor substrate and where the chemical solution is to be applied; and a third step of moving the chemical solution spraying member from the initial position in accordance with a predetermined travel pattern and, simultaneously, spraying the chemical solution from the chemical solution spraying member toward the first face of the semiconductor substrate.

The present invention also provides a chemical solution coating apparatus comprising:

a substrate supporting unit for supporting a semiconductor substrate;

a chemical solution spraying unit for spraying the chemical solution in an atomized state to coat a first face of the semiconductor substrate with the chemical solution;

a travel control unit for disposing the chemical solution spraying unit in the vicinity of the first face of the supported semiconductor substrate and, also, making the chemical solution spraying unit travel along the periphery of the semiconductor substrate; and a spray control unit for coating an area in the vicinity of the periphery of the first face of the semiconductor substrate with the chemical solution while the travel control unit makes the chemical solution spray unit travel.

According to the present invention, the coating process is performed in a state where the semiconductor substrate is fixed without rotating the semiconductor substrate, so that occurrence of a damage caused by drop, crack or the like of the substrate in the coating process can be reduced as compared with conventional spin coating. Thus, the yield of the manufactured substrates can be improved.

In addition, since the semiconductor substrate is not rotated, the semiconductor substrate can be fixed with lower suction force as compared with the conventional suction force. Therefore, occurrence of crack of the semiconductor substrate can be reduced; thus, the yield of the substrates can be improved. Further, the rotating mechanism and the splash preventing cover become unnecessary, so that the coating apparatus can be simplified and the size and cost of the coating apparatus can be reduced.

Since the chemical solution sparing member is moved to coat the substrate with the chemical solution, a necessary amount of the chemical solution can be applied to only the desired area. Thus, the amount of the chemical solution used can be reduced.

DETAILED DESCRIPTION OF THE INVENTION

A chemical solution coating method of the present invention comprises: a first step of disposing a semiconductor substrate on a substrate supporting unit with a first face to be coated with a chemical solution facing upward; a second step of moving a chemical solution spraying member for spraying the chemical solution to an initial position which is positioned in the vicinity of the first face of the semiconductor substrate and where the chemical solution is to be applied; and a third step of moving the chemical solution spraying member from the initial position in accordance with a predetermined travel pattern and, simultaneously, spraying the chemical solution from the chemical solution spraying member toward the first face of the semiconductor substrate. Herein, the first face denotes a face to which the chemical solution is applied.

The wordings of "the chemical solution" as used in the present invention means any coating solution which may be used for coating a surface of a semiconductor substrate.

Herein, the chemical solution coating method is applicable in the case where the chemical solution is a material for forming a diffusion preventing film, the semiconductor substrate is a substrate for a solar battery having a polygonal shape, and the first face of the semiconductor substrate is not a light-reception face.

In the substrate for a solar battery of the present invention, a face, which is not a light-reception face of sunlight, is referred to as a back face and a face, which is a light-reception face of sunlight, is referred to as a surface.

Preferably, the initial position of the chemical solution spraying member is in a region in the vicinity of the periphery of the first face, and the travel pattern is a pattern of moving the chemical solution spraying member along the whole periphery of the semiconductor substrate.

Figure 5:
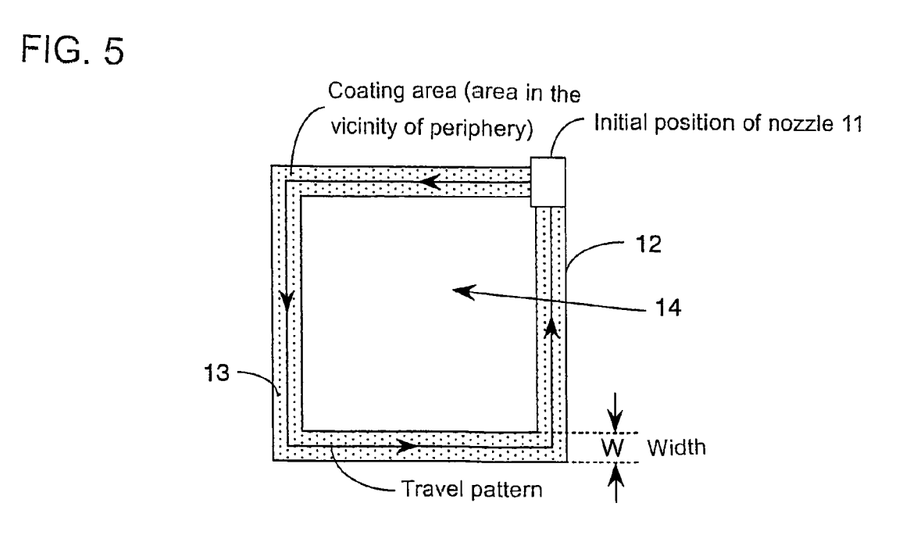
FIG. 5 shows a travel pattern of a nozzle for applying the chemical solution to the back face of the substrate in the present invention.

The region in the vicinity of the periphery denotes a strip-shaped region having a constant width from the periphery of the substrate, for example, a region shown in FIG. 5.

Preferably, the chemical solution spraying member has a spraying mechanism for outputting the housed chemical solution in an atomized state while sucking the chemical solution by negative pressure.

Preferably, the third step includes a process of jetting a gas at a flow rate the sprayed chemical solution does not spread to a second face on the side opposite to the first face, from below toward the semiconductor substrate in a space between a wraparound spreading preventing plate, which is disposed below the position of the semiconductor substrate mounted on the substrate supporting unit so as to surround the substrate supporting part, and the substrate supporting unit.

Herein, the second face denotes a back face of the first face to which the chemical solution is applied.

Preferably, the substrate supporting unit has a supporting member capable of supporting a plurality of semiconductor substrates, the chemical solution spraying member has a plurality of nozzles, a nozzle corresponding to each of the semiconductor substrates is moved to an initial position in the second step, and the plurality of nozzles are moved in accordance with predetermined travel patterns and the chemical solution is sprayed simultaneously from the nozzles toward the first face of the semiconductor substrate corresponding to the nozzles in the third step.

The present invention also provides a chemical solution coating apparatus comprising: a substrate supporting unit for supporting a semiconductor substrate; a chemical solution spraying unit for spraying the chemical solution in an atomized state to coat a first face of the semiconductor substrate with the chemical solution; a travel control unit for disposing the chemical solution spraying unit in the vicinity of the first face of the supported semiconductor substrate and, also, making the chemical solution spraying unit travel in accordance with a predetermined travel pattern; and a spray control unit for coating a specific area in the first face of the semiconductor substrate with the chemical solution while the travel control unit makes the chemical solution spray unit travel.

Herein, the semiconductor substrate coated with the chemical solution has a polygonal shape, and a substrate for a solar battery, having a thickness in a range from 100 μm to 500 μm, can be used as this semiconductor substrate.

In the case where the substrate is a substrate for a solar battery, the chemical solution is a material for forming a diffusion preventing film. In the case where the first face of the semiconductor substrate is not a light-reception face of sunlight, an area to be coated with the chemical solution is an area in the vicinity of the periphery of the first face, and the travel pattern is a pattern of the chemical solution spraying member traveling along the whole periphery of the semiconductor substrate.

Preferably, the chemical solution coating apparatus of the present invention further comprises: a wraparound spreading preventing plate disposed in a position below the position of the semiconductor substrate mounted on the substrate supporting-unit and apart from the substrate supporting unit only by a predetermined distance "d" so as to surround the substrate supporting part whose substrate mounting face is smaller than the area of the semiconductor substrate; and a gas jetting unit for jetting a predetermined flow rate of gas from below toward the semiconductor substrate in a space formed by the predetermined distance "d".

Preferably, the substrate supporting unit has a supporting member capable of supporting a plurality of semiconductor substrates, the chemical solution spraying unit has a plurality of nozzles, and the travel control unit disposes each of the plurality of nozzles in the vicinity of a corresponding semiconductor substrate and, after that, makes the nozzles travel in accordance with a predetermined pattern.

The present invention also provides a chemical solution coating method executed by using a chemical solution coating apparatus comprising: a substrate supporting unit for supporting a semiconductor substrate; a chemical solution spraying unit for spraying a chemical solution in an atomized state to coat a first face of the semiconductor substrate with the chemical solution; a travel control unit for disposing the chemical solution spraying unit in the vicinity of the first face of the supported semiconductor substrate and, also, making the chemical solution spraying unit travel along the periphery of the semiconductor substrate; and a spray control unit for coating an area in the vicinity of the periphery of the first face of the semiconductor substrate with the chemical solution while the travel control unit makes the chemical solution spraying unit travel, and the method comprises: a first step of making the semiconductor substrate supported on the substrate supporting unit with the first face to be coated with a chemical solution facing upward; a second step of moving the chemical solution spraying unit for spraying the chemical solution to an initial position which is positioned in the vicinity of the first face of the semiconductor substrate and where the chemical solution is to be applied by the travel control unit; and a third step of moving the chemical solution spraying unit from the initial position in accordance with a predetermined travel pattern and, simultaneously, spraying the chemical solution from the chemical solution spraying unit toward the first face of the semiconductor substrate by the spray control unit.

DESCRIPTION OF THE PREFERRED EMBODIMENT

An embodiment of the present invention will be described below with reference to the drawings. However, the present invention is not limited to the following embodiment.

Figure 1:
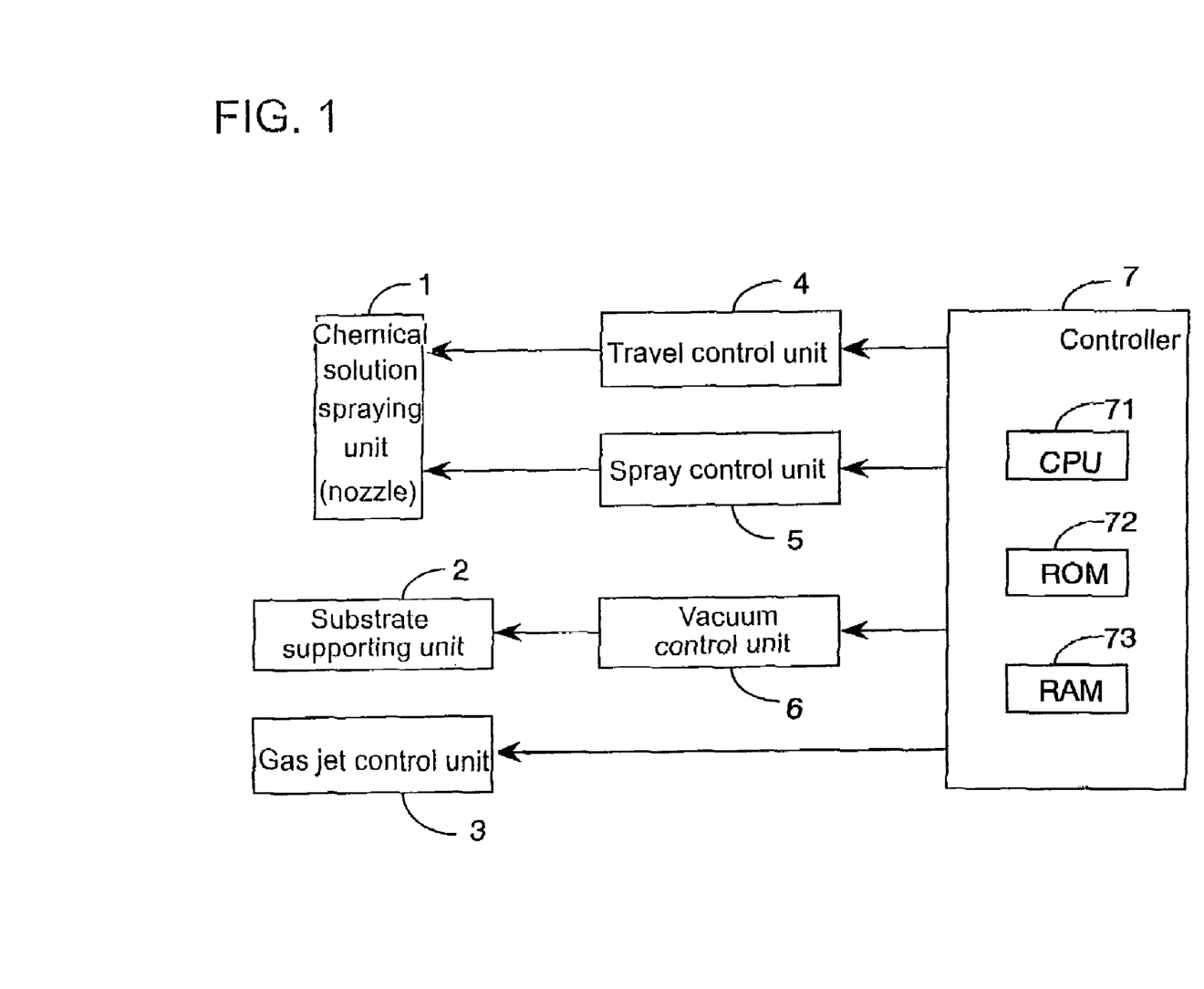
FIG. 1 is a configuration block diagram showing an embodiment of a chemical solution coating apparatus of the present invention.

FIG. 1 is a configuration block diagram of a chemical solution coating apparatus as an embodiment of the present invention.

The chemical solution coating apparatus of the present invention is constructed by a nozzle 1 (chemical solution spraying unit) for spraying a chemical solution in an atomized state, a substrate supporting unit 2 for fixedly supporting a substrate, a gas jet control unit 3 for jetting gas for preventing wraparound spreading of a chemical solution to be applied, a travel control unit 4 for making the nozzle 1 travel, a spray control unit 5 for controlling a spray amount of the chemical solution from the nozzle 1, a vacuum control unit 6 for holding the substrate on the substrate supporting unit 2 by suction, and a controller 7 for controlling operations of the respective control units (3, 4, 5, 6) at proper timings.

As the controller 7, for example, a microcomputer constructed by a CPU 71, a ROM 72, a RAM 73, a timer and an I/O controller can be used. In the ROM 72 or the RAM 73, a control program of a procedure for controlling the operations of the respective control units is stored. When the CPU 71 operates on the basis of the control program, the chemical solution coating process of the present invention is executed.

The nozzle 1 is used to output a predetermined amount of the chemical solution stored in a tank, from a jet port at a predetermined pressure when a valve provided around the jet port is opened or the like. In the present invention, without rotating the substrate, the chemical solution is applied to a specific area of the substrate by moving the nozzle. Consequently, it is preferable to provide a mechanism for spraying the chemical solution in an atomized state to the substrate not simply dropping the chemical solution.

For example, it is preferable to use a spray nozzle such that predetermined pressure is applied to the chemical solution and, when the valve is opened, the chemical solution is sprayed. Further, it is preferable to use a nozzle of a vacuum type having a mechanism of applying a negative pressure to the upper part of a tank for storing a chemical solution and spraying the chemical solution at relatively low pressure while holding the chemical solution by negative pressure in order to uniformly coat a substrate with the chemical solution while preventing the chemical solution from being spread to the face opposite to the coated surface.

Figure 2A:
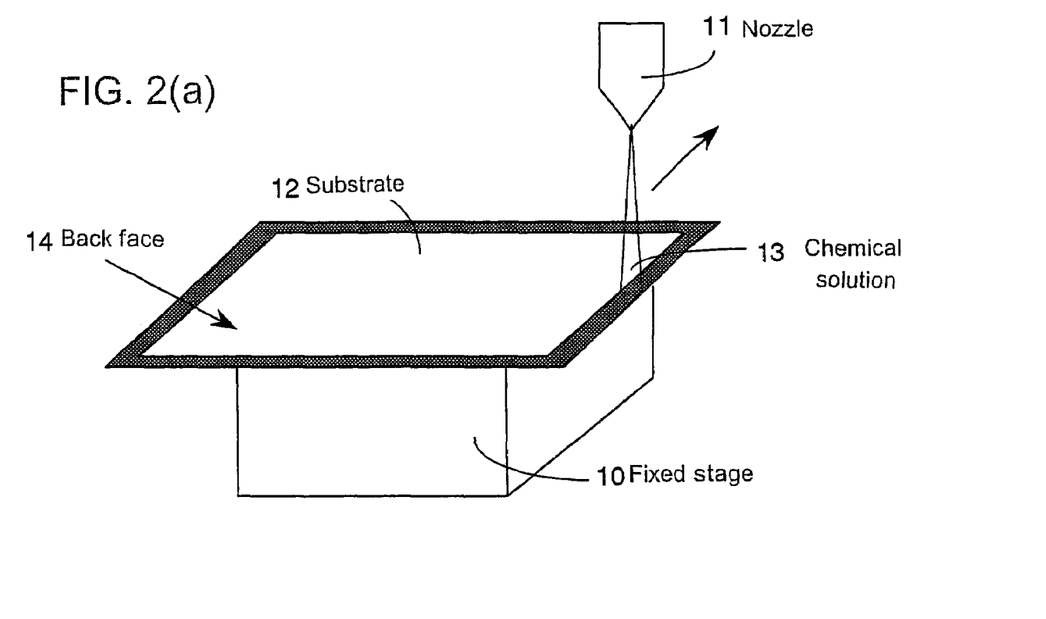
FIGS. 2A and 2B show coating of the back face of a substrate with a chemical solution in the present invention.
Figure 2B:
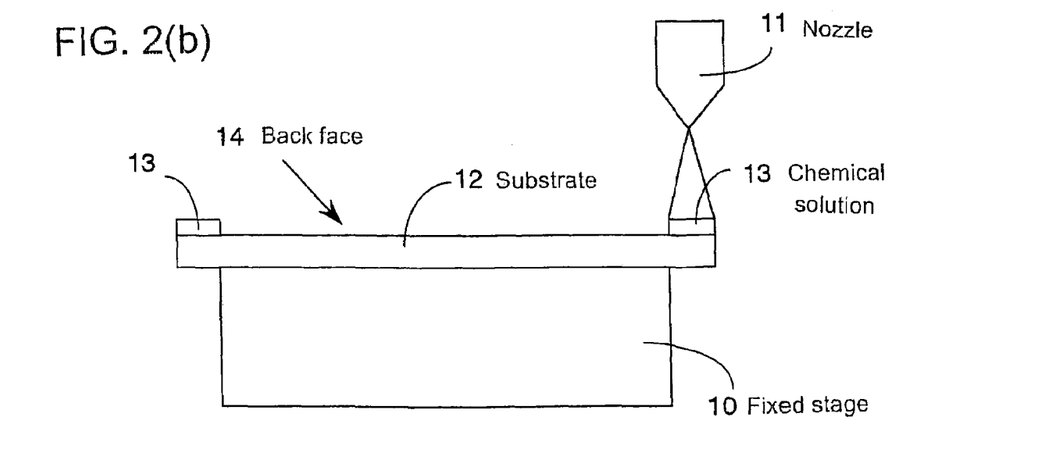

The substrate supporting unit 2 is a fixed stage 10 (see FIG. 2) on which a semiconductor substrate used for a solar battery is mounted. It is preferable to use a metal stage whose part on which a substrate is mounted is flat. Since the substrate supporting unit 2 is not rotated, a conventional rotating mechanism is unnecessary. A substrate 12 is mounted on the fixed stage 10 with the face to which the chemical solution is applied (coating surface, first surface) facing upward.

Figure 4:
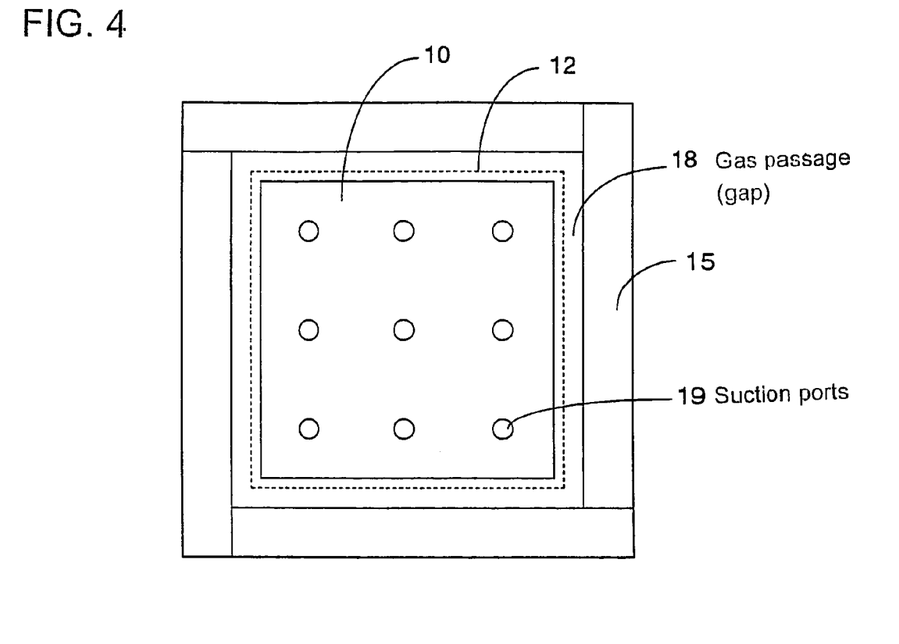
FIG. 4 shows layout of a fixed stage and a wraparound spreading preventing plate in the present invention.

Since the substrate which is simply placed cannot be supported so as not to be moved, it is preferable to provide a mechanism for fixing the substrate. For example, as shown in FIG. 4, it is preferable to open a plurality of suction ports 19 in the mounting surface of the fixed stage 10 and to hold the mounted substrate 12 by suction from below through the suction ports 19.

The area of the substrate mounting surface of the fixed stage 10 is, preferably, smaller than that of the mounted substrate 12 to prevent the applied chemical solution from remaining and being transferred to the next substrate. When viewed from above as shown in FIG. 4, the semiconductor substrate 12 having the outer shape shown by a dotted line is aligned and fixed so as to cover the whole mounting surface of the fixed stage 10. It is sufficient to align a substrate by a substrate carrying unit (not shown) for mounting the substrate 12 onto the fixed stage 10.

The travel control unit 4 is a part for making the nozzle 1 travel and moves the nozzle 1 to the initial position in the vicinity of a substrate facing the surface to be coated of the substrate on the basis of an instruction from the controller 7. At the time of applying the chemical solution, the travel control unit 4 moves the nozzle 1 at a predetermined speed in accordance with a predetermined travel pattern in such a manner that the chemical solution is sprayed on a predetermined area.

The spray control unit 5 controls a spray amount of the chemical solution output from the jet port of the nozzle 1 on the basis of the instruction from the controller 7.

The vacuum control unit 6 holds the substrate by suction via the suction ports 19 formed in the fixed stage 10. A vacuum pump can be used.

The gas jet control unit 3 is a mechanism for preventing the jetted chemical solution from spreading to the surface (the second surface) opposite to the surface to be coated at the time of applying the chemical solution. The gas jet control unit 3 is constructed by, for example, a wraparound spreading preventing plate 15 and a gas jetting part 16 as shown in FIG. 3.

The wraparound spreading preventing plate 15 is provided at a position below the position of the substrate 12 mounted on the fixed stage 10 so as to surround the fixed stage 10 in the vicinity of the fixed stage 10 as shown in FIG. 4 and apart from the fixed stage 10 by a predetermined distance "d". The wraparound spreading preventing plate 15 is disposed at a position so that a gap is created between the edge of the substrate 12 and the wraparound spreading preventing plate 15 when the substrate 12 is mounted on the fixed stage 10. The predetermined distance "d" and the gap vary according to the kinds of substrates and coating parameters and cannot be unconditionally determined. As an example, the predetermined distance "d" can be set to about 2 to 10 mm.

Figure 3A:
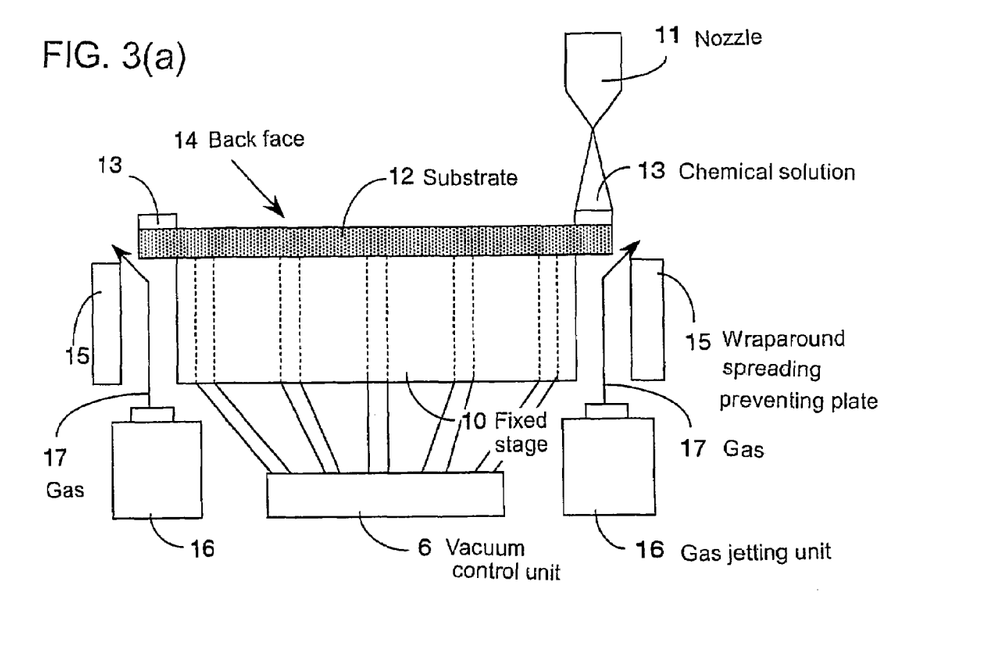
FIGS. 3A and 3B show a process of preventing a chemical solution from spreading to the back face in the present invention.
Figure 3B:
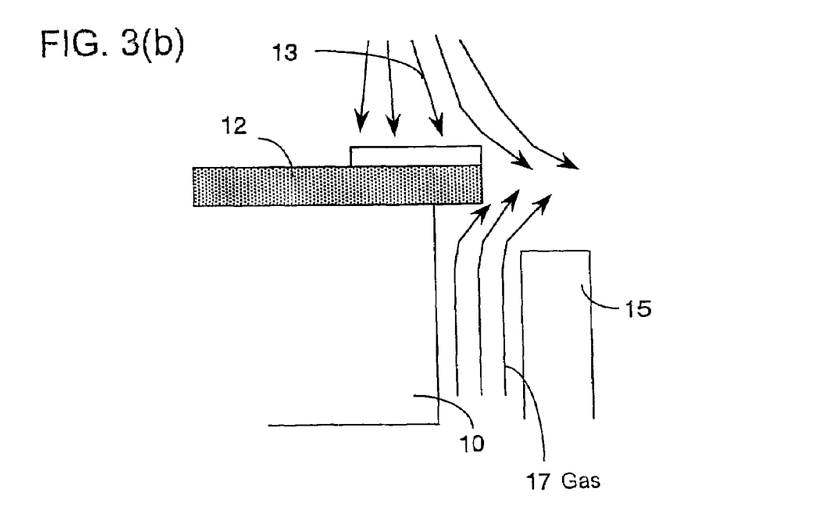

As shown in FIGS. 3A and 3B, the gas jetting part 16 is provided below the fixed stage 10 and the wraparound spreading preventing plate 15, and jets gas 17 from below the fixed stage 10 toward the substrate through the gap (gas passage 18 in FIG. 4) between the fixed stage 10 and the wraparound spreading preventing plate 15.

As the gas 17 to be jetted, for example, an inactive gas such as nitrogen can be used. The flow rate of the gas 17 is set to an extent that the sprayed chemical solution 13 does not spread to the surface (second surface) opposite to the surface to be coated. Preferably, the flow rate is almost the same as or slightly lower than the spray flow rate of the chemical solution. The gas 17 flows in the direction as shown by the arrows in FIGS. 3A and 3B.

As shown in FIG. 3B, a chemical solution 13 and the gas 17 collide with each other around the side face of the substrate 12 and both of the chemical solution 13 and the gas 17 flow to the outside. Thus, the chemical solution 13 can be prevented from being spread to the surface (second surface) opposite to the surface coated with the chemical solution.

Although one chemical solution coating apparatus may be used to coat semiconductor substrates with a chemical solution one by one, from the viewpoint of improvement in productivity, it is also possible to provide one chemical solution coating apparatus with a fixed stage capable of supporting a plurality of semiconductor substrates and a plurality of chemical solution spraying members (nozzles), move the plurality of nozzles in the same travel pattern, and simultaneously spray the chemical solution to the plurality of semiconductor substrates. With this configuration, the efficiency of coating the semiconductor substrates with the chemical solution can be improved.

The chemical solution coating apparatus of the present invention has the configuration as described above. An example of coating the semiconductor substrate 12 used for a solar battery with a chemical solution by using the chemical solution coating apparatus will be described below.

It is assumed herein that an angular substrate is used as shown in FIG. 2 as the semiconductor substrate 12 used for a solar battery.

The shape is not limited to the quadrangle shown in FIG. 2, but may be triangle, pentagon or, generally, a polygonal shape. A circular substrate can be also used in a manner similar to the conventional technique. The thickness of the semiconductor substrate 12 is set to a range from 100 μm to 500 μm.

As the semiconductor substrate 12, a substrate made of a material such as silicon is used. The face irradiated with sunlight (referred to as "surface") is coated with a dopant solution. The face opposite to the surface (referred to as "back face 14") is coated with a chemical solution 13 for forming a diffusion preventing film.

The dopant solution applied to the surface of the substrate 12 is a chemical solution containing a material as a diffusion source (such as $P_2O_5$).

The chemical solution 13 applied to the back face 14 of the substrate is, for example, a solution containing titanic acid (TG: Titanic Glass). More specifically, a chemical solution obtained by mixing 100 cc of ethyl alcohol, 20 cc of isopropyl titanate, and 10 cc of acetic acids can be used.

First, a general manufacturing process of the substrate for a solar battery will be described.

The substrate for a solar battery of the present invention is manufactured by, for example, the following processes.

Process "a": Process of Etching Silicon Substrate

Herein, as a semiconductor substrate, a silicon substrate having a rectangular shape of about 150 mm×150 mm is prepared. In order to smooth the substrate surface and to form a texture structure for efficiently confining light in a light generating layer, part of the surface of the silicon substrate is etched by using an NaOH solution or the like.

Process "b": Surface Coating Process

Herein, the face (surface), which is irradiated with sunlight, of the substrate is coated with a dopant solution containing a diffusion source ($P_2O_5$ or the like). The substrate with its surface facing upward is mounted on the fixed stage 10.

Process "c": Back Face Coating Process

The face (back face), which is not irradiated with sunlight, of the substrate is coated with the material of forming the diffusion preventing film. The diffusion preventing film is formed in a region in the vicinity of the periphery of the back face. The substrate is turned upside down and is mounted on the fixed stage 10 with the back face thereof facing upward. The details of the process "c" will be described later.

Process "d": Diffusion Process

By performing heat treatment (at 850 to 950° C.) in a diffusion oven, the diffusion source contained in the dopant solution applied to the surface of the substrate is diffused in the surface of the substrate, thereby forming an n+ layer.

Process "e": Process of Peeling Off Diffusion Preventing Film

The diffusion preventing film formed in the process "c" is peeled off. It is sufficient to peel off the diffusion preventing film by using an HF solution or the like.

Process "f": Process of Forming Anti-reflection Film

By using PVD (Physical Vapor Deposition), CVD (Chemical Vapor Deposition) or the like, the material for forming an anti-reflection film (such as $SiO_2$, $TiO_2$, $Ta_2O_5$ or the like) is deposited on the surface of the substrate.

Process "g": Electrode Printing Process

A first electrode is formed in a predetermined position in the surface of a substrate and a second electrode is formed in a region as large as possible in the back face of the substrate. As the material of the first electrode, for example, Ag is used. As the material of the second electrode, Al can be used. The electrodes can be formed by, for example, printing, deposition or plating.

Process "h": Dip Soldering Process

The electrodes formed in the process "g" are plated and covered with solder.

By the above processes, one solar battery substrate is manufactured and is completed after conducting a predetermined electric characteristic test.

Among the processes, in the processes "b" and "c", each of the faces is coated with the chemical solution by using the chemical solution coating apparatus of the present invention shown in FIG. 1.

In the process "b", the dopant solution is applied to the whole surface of the substrate. The area coated with the dopant solution sprayed from the nozzle 11 fixed in a certain position is limited to a very small area. Consequently, the nozzle 11 is moved to coat along the whole surface of the substrate. For example, in the case of the surface of a quadrangle shape, the nozzle 11 is moved in the horizontal direction parallel to a side of the periphery to coat the surface including the periphery with the dopant solution. After that, the nozzle 11 is moved only by a predetermined distance in the vertical direction and is moved in the direction opposite to that of the preceding movement to apply the dopant solution. It is sufficient to repeat the travel pattern.

In the process "c", the nozzle is moved in a travel pattern as will be described later.

The travel pattern of the nozzle is not limited to the above but, an optional pattern can be employed in correspondence with the shape and size of the substrate. It is sufficient to include the travel pattern in a program to be stored in the ROM or the like of the controller 7.

FIGS. 2A and 2B show the process "c" of coating the back face 14 of the semiconductor substrate 12 with the chemical solution 13 (the material for forming the diffusion preventing film).

FIG. 2A is a perspective view showing a region coated with the chemical solution 13, and FIG. 2B is a diagram showing part of the cross section. Herein, the chemical solution 13 is applied to an area having a predetermined width in the vicinity of the periphery of the back face 14 of the substrate 12 (referred to as the area in the vicinity of the periphery, which is the hatched portion).

The process of coating the back face 14 with the material for forming the diffusion preventing film in the process "c" in the present invention is mainly constructed by the following three steps.

(1) First Step

The semiconductor substrate 12 of a solar battery is aligned and mounted on the fixed stage 10 and is fixed by suction so as not to be moved. At this time, the semiconductor substrate 12 is mounted with its back face 14 facing upward so that the back face 14 can be coated with the chemical solution 13.

(2) Second Step

The nozzle 11 is moved to an initial position $I_0$ which is in the peripheral area (see FIG. 5) of the back face 14 of the substrate and in which the chemical solution 13 is to be applied.

(3) Third Step

Herein, the following three processes are performed simultaneously.

(i) The nozzle 11 is sequentially moved from the initial position $I_0$ in accordance with a predetermined travel pattern.

(ii) The chemical solution 13 is sprayed from the nozzle 11 toward the back face 14 of the substrate.

(iii) The gas 17 is jetted from below toward the substrate 12 in the space between the wraparound spreading preventing plate 15 and the fixed stage 10.

(4) The third step is performed until the nozzle 11 moves along the outer periphery of the substrate 12 and returns to the initial position.

As described above, the substrate 12 is mounted on the fixed stage 10 by suction so as not to be moved, so that the nozzle 11 is moved at constant speed so that the chemical solution is applied uniformly. The control of moving the nozzle 11 is performed by the travel control unit 4 on the basis of an instruction of the controller 7.

FIG. 5 shows an example of the nozzle travel pattern.

For example, first, the nozzle 11 is moved to the initial position $I_0$ which is positioned in the vicinity of the back face 14 of the substrate and where the chemical solution is to be applied. Next, the nozzle 11 is moved around along the outer peripheral region of the back face 14 as shown in FIG. 5.

Although not shown in FIG. 2, the wraparound spreading preventing plate 15 and the gas jetting part 16 are disposed around and below the fixed stage 10 as shown in FIG. 3A. When the chemical solution 13 is applied, as shown in FIG.

3, the gas 17 is always jetted upward at a flow rate to an extent that the chemical solution 13 does not spread to the side opposite to the coating face of the substrate via the gap (gas passage 18 in FIG. 4) between the wraparound spreading preventing plate 15 and the substrate 12.

In order to assure the area of the second electrode formed on the back face 14 as large as possible in the subsequent process "g", the width ("w" in FIG. 5) of the diffusion preventing film formed by applying the chemical solution 13 is preferably as narrow as possible. For example, the width "w" is preferably about 10 mm or less from the outer periphery of the substrate. More preferably, the width "w" of the diffusion preventing film formed on the back face lies in the range from 1 mm to 3 mm.

In the case where the back face of the semiconductor substrate of a solar battery is coated with the material for forming the diffusion preventing film by the method as described above, the following effects are exhibited.

Since the semiconductor substrate is fixed without being rotated, the semiconductor substrate does not drop and the yield of the solar battery substrate can be improved as compared with the conventional spin coating. Although the substrate is held by suction so as to be fixed, the substrate is not rotated, so that weaker suction force is sufficient as compared with that in the spin coating. Therefore, occurrence of a crack in the substrate due to suction is reduced and the yield of the solar battery substrate can be improved.

Since the rotating mechanism, the splash preventing cover and the like which are necessary to execute the conventional spin coating become unnecessary, the configuration of the apparatus can be simplified and the cost can be reduced. Since the desired region is coated with the material for forming the diffusion preventing film by moving the nozzle, the amount of the material used can be reduced and the cost can be decreased.

What is claimed is:

1. The chemical solution coating method comprising:
   a first step of disposing a semiconductor substrate on a substrate supporting unit with a first face to be coated with a chemical solution facing upward;
   a second step of moving a chemical solution spraying member for spraying the chemical solution to an initial position which is positioned in the vicinity of the first face of the semiconductor substrate and where the chemical solution is to be applied; and
   a third step of moving the chemical solution spraying member from the initial position in accordance with a predetermined travel pattern and, simultaneously, spraying the chemical solution from the chemical solution spraying member toward the first face of the semiconductor substrate to complete said coating method while continuously spraying the chemical solution, wherein
   the chemical solution is a material for forming a diffusion preventing film,
   the semiconductor substrate is a substrate for a solar battery having a polygonal shape,
   the first face of the semiconductor substrate is not a light-reception face,
   the initial position of the chemical solution spraying member is in a region in the vicinity of the periphery of the first face of the semiconductor substrate,
   the travel pattern is a pattern of moving the chemical solution spraying member along the whole periphery of the semiconductor substrate
   the chemical solution spraying member has a spraying mechanism for outputting the housed chemical solution in an atomized state while sucking the chemical solution by negative pressure, and
   the third step includes a process of jetting a gas at a flow rate such that the sprayed chemical solution does not spread to a second face on the side opposite to the first face, from below toward the semiconductor substrate in a space between a wraparound spreading preventing plate, which is disposed below the position of the semiconductor substrate mounted on the substrate supporting unit so as to surround the substrate supporting part, and the substrate supporting unit.

2. The chemical solution coating method according to claim 1, wherein
   the substrate supporting unit has a supporting member capable of supporting a plurality of semiconductor substrates,
   the chemical solution spraying member has a plurality of nozzles,
   a nozzle corresponding to each of the semiconductor substrates is moved to an initial position in the second step, and
   the plurality of nozzles are moved in accordance with predetermined travel patterns and the chemical solution is sprayed simultaneously from the nozzles toward the first face of the semiconductor substrate corresponding to the nozzles in the third step.

3. The chemical solution coating method comprising:
   a first step of disposing a semiconductor substrate on a substrate supporting unit with a first face to be coated with a chemical solution facing upward;
   a second step of moving a chemical solution spraying member for spraying the chemical solution to an initial position which is positioned in the vicinity of the first face of the semiconductor substrate and where the chemical solution is to be applied; and
   a third step of moving the chemical solution spraying member from the initial position in accordance with a predetermined travel pattern and, simultaneously, spraying the chemical solution from the chemical solution spraying member toward the first face of the semiconductor substrate to complete said coating method while continuously spraying the chemical solution,
   wherein said substrate is coated without being rotated,
   the chemical solution is a material for forming a diffusion preventing film,
   the semiconductor substrate is a substrate for a solar battery having a polygonal share,
   the first face of the semiconductor substrate is not a light-reception face,
   the initial position of the chemical solution spraying member is in a region in the vicinity of the periphery of the first face of the semiconductor substrate,
   the travel pattern is a pattern of moving the chemical solution spraying member along the whole periphery of the semiconductor substrate,
   the chemical solution spraying member has a spraying mechanism for outputting the housed chemical solution in an atomized state while sucking the chemical solution by negative pressure, and
   the third step includes a process of jetting a gas at a flow rate such that the sprayed chemical solution does not spread to a second face on the side opposite to the first face, from below toward the semiconductor substrate in a space between a wraparound spreading preventing plate, which is disposed below the position of the semiconductor substrate mounted on the substrate supporting unit so as to surround the substrate supporting part, and the substrate supporting unit.

4. The chemical solution coating method according to claim 3, wherein the substrate supporting unit has a supporting member capable of supporting a plurality of semiconductor substrates, the chemical solution spraying member has a plurality of nozzles, a nozzle corresponding to each of the semiconductor substrates is moved to an initial position in the second step, and the plurality of nozzles are moved in accordance with predetermined travel patterns and the chemical solution is sprayed simultaneously from the nozzles toward the first face of the semiconductor substrate corresponding to the nozzles in the third step.

* * * * *